(12) United States Patent
Huang et al.

(10) Patent No.: US 11,862,650 B2
(45) Date of Patent: Jan. 2, 2024

(54) WAVE GUIDE FILTER FOR SEMICONDUCTOR IMAGING DEVICES

(71) Applicant: Taiwan Semiconductor Manufacturing Company, Ltd., Hsin-Chu (TW)

(72) Inventors: Cheng Yu Huang, Hsinchu (TW); Chun-Hao Chuang, Hsinchu (TW); Chien-Hsien Tseng, Hsinchu (TW); Kazuaki Hashimoto, Zhubei (TW); Keng-Yu Chou, Kaohsiung (TW); Wei-Chieh Chiang, Yuanlin Township (TW); Wen-Chien Yu, Hsinchu (TW); Ting-Cheng Chang, Hsinchu (TW); Wen-Hau Wu, New Taipei (TW); Chih-Kung Chang, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/579,030

(22) Filed: Jan. 19, 2022

(65) Prior Publication Data

US 2022/0139983 A1 May 5, 2022

Related U.S. Application Data

(62) Division of application No. 16/416,583, filed on May 20, 2019, now Pat. No. 11,233,081.

(Continued)

(51) Int. Cl.
*H01L 27/14* (2006.01)
*H01L 27/146* (2006.01)

(52) U.S. Cl.
CPC .... *H01L 27/14621* (2013.01); *H01L 27/1462* (2013.01); *H01L 27/1463* (2013.01);
(Continued)

(58) Field of Classification Search
CPC ................... H01L 27/14636; H01L 27/1462
See application file for complete search history.

(56) References Cited

U.S. PATENT DOCUMENTS

2013/0270667 A1* 10/2013 Wang ............... H01L 27/14621
257/443
2014/0146207 A1 5/2014 Yokogawa
(Continued)

OTHER PUBLICATIONS

Non-Final Office Action dated Feb. 1, 2021 for U.S. Appl. No. 16/416,583.
(Continued)

*Primary Examiner* — Trang Q Tran
(74) *Attorney, Agent, or Firm* — Eschweiler & Potashnik, LLC

(57) ABSTRACT

In some embodiments, an image sensor is provided. The image sensor includes a photodetector disposed in a semiconductor substrate. A wave guide filter having a substantially planar upper surface is disposed over the photodetector. The wave guide filter includes a light filter disposed in a light filter grid structure. The light filter includes a first material that is translucent and has a first refractive index. The light filter grid structure includes a second material that is translucent and has a second refractive index less than the first refractive index.

20 Claims, 14 Drawing Sheets

Related U.S. Application Data

(60) Provisional application No. 62/736,779, filed on Sep. 26, 2018.

(52) U.S. Cl.
CPC .... *H01L 27/1464* (2013.01); *H01L 27/14636* (2013.01); *H01L 27/14645* (2013.01); *H01L 27/14685* (2013.01)

(56) References Cited

U.S. PATENT DOCUMENTS

| | | |
|---|---|---|
| 2014/0210030 A1 | 7/2014 | Miki |
| 2014/0339606 A1 | 11/2014 | Lin et al. |
| 2016/0043120 A1 | 2/2016 | Ahn et al. |
| 2016/0276394 A1 | 9/2016 | Chou et al. |
| 2016/0276395 A1 | 9/2016 | Chou et al. |
| 2016/0307940 A1 | 10/2016 | Cheng et al. |
| 2016/0307941 A1* | 10/2016 | Cheng ............... H01L 27/14623 |

OTHER PUBLICATIONS

Notice of Allowance dated Sep. 15, 2021 for U.S. Appl. No. 16/416,583.

* cited by examiner

WAVE GUIDE FILTER FOR SEMICONDUCTOR IMAGING DEVICES

REFERENCE TO RELATED APPLICATIONS

This application is a Divisional of U.S. application Ser. No. 16/416,583, filed on May 20, 2019, which claims the benefit of U.S. Provisional Application No. 62/736,779, filed on Sep. 26, 2018. The contents of the above-referenced patent applications are hereby incorporated by reference in their entirety.

BACKGROUND

Many modern day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors. Compared to CCD pixel sensors, CMOS pixel sensors are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
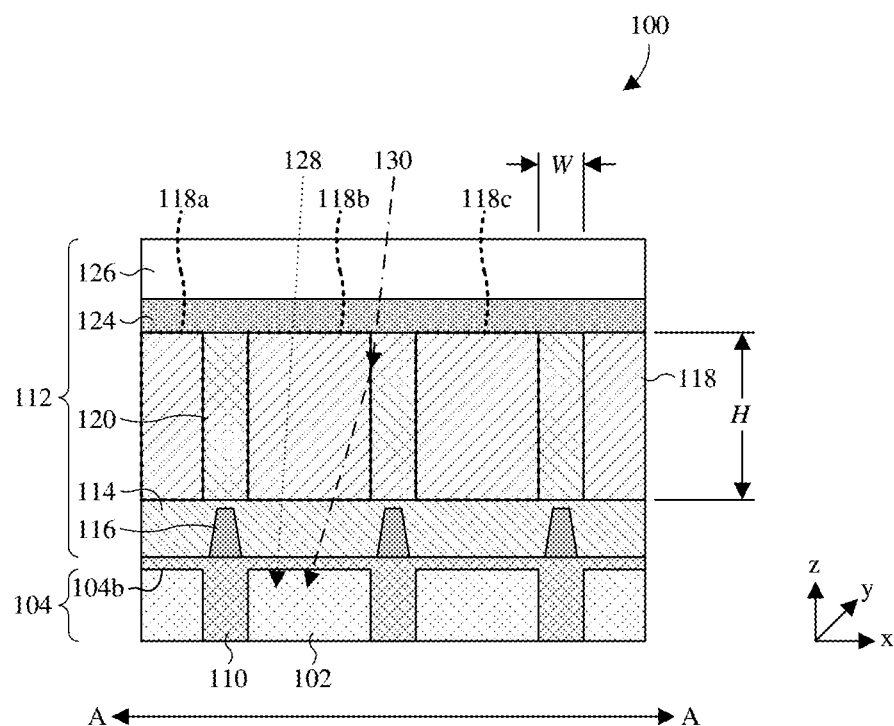
FIGS. 1A-1B illustrate various views of some embodiments of an image sensor comprising a wave guide filter having a substantially planar upper surface.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide semiconductor image sensors (CISs) include a plurality of photodetectors disposed in a semiconductor substrate. A light filter array (e.g., a color filter array) having a plurality of light filters (e.g., color filters) disposed in a light filter grid structure is disposed over the photodetectors. A plurality of microlenses are typically disposed over the light filter array, such that the light filter array separates the microlenses from the photodetectors. Typically, the microlenses have a rounded upper surface, such that the microlenses focus incident radiation (e.g., photons) onto the photodetectors.

A challenge with the above CISs is an amount of incident radiation that the microlenses focus onto the photodetectors. To improve the performance of CISs (e.g., increase pixel resolution, decrease form factor, etc.), feature sizes of the CISs are typically scaled down. However, as microlenses are scaled down (e.g., as radii of the microlenses are scaled down near/below the wavelength of incident radiation), diffraction may negatively affect an amount of radiation that the microlenses focus onto the photodetectors. Accordingly, as feature sizes of CISs continue to scale down, microlenses may negatively affect the quantum efficiency (QE) of CISs.

In various embodiments, the present application is directed toward a wave guide filter having a substantially planar upper surface. The wave guide filter is disposed over a photodetector and comprises a light filter disposed in a light filter grid structure, the light filter grid structure and the light filter being at least partially translucent to light (e.g., photons having a wavelength between about 10 nanometers (nm) and about 1 millimeter (mm)). The light filter comprises a first material having a first refractive index, and the light filter grid structure comprises a second material having a second refractive index that is less than the first refractive index. The wave guide filter is configured to guide incident light toward the photodetector.

Because both the light filter and the light filter grid structure are at least partially translucent, both the light filter and the light filter grid may guide light toward the photodetector. Further, because the first refractive index is greater than the second refractive index, light incident to the light filter is confined to the light filter (e.g., due total internal reflection) and guided onto the photodetector. In addition, because the second refractive index is less than the first refractive index, most of the light incident to the light filter grid structure is guided to the light filter and refracted toward the photodetector, thereby guiding the light incident to the light filter grid structure onto the photodetector. Thus, the wave guide filter may have a substantially planar upper surface and focus incident radiation onto the photodetectors, thereby decreasing the negative diffraction effects caused by the scaled down microlenses. Accordingly, the wave guide filter may improve the QE of CISs having scaled down feature sizes (e.g., less than about 1 micrometer (um)).

Figure 1B:
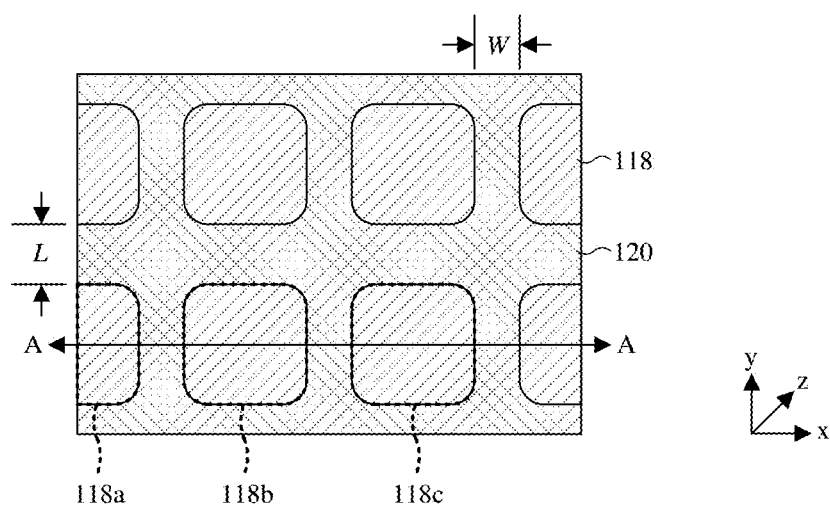

FIGS. 1A-1B illustrate various views of some embodiments of an image sensor 100 comprising a wave guide filter having a substantially planar upper surface. FIG. 1A illustrates a cross-sectional view taken along line A-A of FIG. 1B. FIG. 1B illustrates a view of the image sensor 100 facing a back-side of the semiconductor substrate.

As shown in FIGS. 1A-1B, the image sensor 100 comprises a plurality of photodetectors 102 disposed in a semiconductor substrate 104. The plurality of photodetectors 102 are configured to absorb incident radiation (e.g., photons) and generate respective electrical signals corresponding to the incident radiation. In further embodiments, the semiconductor substrate 104 comprises any type of semiconductor body (e.g., monocrystalline silicon/CMOS bulk, silicon-germanium (SiGe), silicon on insulator (SOI), etc.).

In some embodiments, an isolation structure 110 is disposed over/in the semiconductor substrate 104. In further embodiments, the isolation structure 110 is disposed on a back-side 104b of the semiconductor substrate 104. In yet further embodiments, the isolation structure 110 extends into the semiconductor substrate 104 between the plurality of photodetectors 102 from the back-side 104b of the semiconductor substrate 104.

A wave guide filter 112 having a substantially planar upper surface is disposed over the semiconductor substrate 104. In some embodiments, the wave guide filter 112 is disposed over the back-side 104b of the semiconductor substrate 104. In further embodiments, the wave guide filter 112 comprises a dielectric layer 114 disposed on the isolation structure 110.

In some embodiments, a metal grid 116 is disposed in the dielectric layer 114. In further embodiments, a first portion of the metal grid 116 is disposed on a first side of one of the photodetectors 102, and a second portion of the metal grid 116 is disposed on a second side of the one of the photodetectors 102 opposite the first side. In such embodiments, a portion of the dielectric layer 114 that is disposed directly over the one of the photodetectors 102 may separate the first portion of the metal grid 116 from the second portion of the metal grid 116. In yet further embodiments, the metal grid 116 may comprise, for example, tungsten, copper, aluminum, or the like.

A first plurality of light filters 118 are disposed in a first light filter grid structure 120 and are disposed over the photodetectors 102. In some embodiments, the first plurality of light filters 118 are disposed in a first light filter array comprising a plurality of rows and columns. For example, the first plurality of light filters 118 may comprise a first light filter 118a configured to transmit light (e.g., photons having a wavelength between about 10 nm and about 1 mm) having wavelengths in a first range, a second light filter 118b configured to transmit light having wavelengths in a second range different than the first range, and a third light filter 118c configured to transmit light having wavelengths in a third range different than the first and second range. In further embodiments, the first light filter 118a, the second light filter 118b, and the third light filter 118c may be disposed in a same row. In further embodiments, each light filter of the first plurality of light filters 118 corresponds to a photodetector of the plurality of photodetectors 102.

In some embodiments, the first plurality of light filters 118 may be color filters. For example, the first light filter 118a may be a red color filter, the second light filter 118b may be a green color filter, and the third light filter 118c may be a blue color filter. In further embodiments, the first plurality of light filters 118 may be infrared (IR) filters configured to filter incident radiation having an IR wavelength. In yet further embodiments, the first plurality of light filters 118 may comprise a combination of color filters and IR filters.

In some embodiments, the first light filter grid structure 120 defines a layout of the first plurality of light filters 118. In further embodiments, the first light filter grid structure 120 may be vertically aligned with the metal grid 116. In further embodiments, each of the first plurality of light filters 118 may have a substantially similar footprint (e.g., an area one of the first plurality of light filters 118 projects onto the dielectric layer 114). In further embodiments, a width W of the first light filter grid structure 120 may be substantially the same between each column of the light filter array. In further embodiments, a length L of the first light filter grid structure 120 may be substantially the same between each row of the light filter array. In yet further embodiments, the width W of the first light filter grid structure 120 may be different than the length L of the first light filter grid structure 120. In other embodiments, the width W and the length L may be about the same.

A first interface layer 124 is disposed over both the first plurality of light filters 118 and the first light filter grid structure 120. In some embodiments, the first interface layer 124 has a substantially planar upper surface. An anti-reflective coating (ARC) 126 is disposed over the first interface layer 124. In some embodiments, the ARC 126 has a substantially planar upper surface. In further embodiments, the substantially planar upper surface of the ARC 126 may define an uppermost surface of the wave guide filter 112.

In some embodiments, the first plurality of light filters 118 comprise a first light filtering material having a first refractive index. In further embodiments, the first refractive index may be between about 1.4 and about 4. In further embodiments, the first light filtering material may comprise, for example, a photoresist (e.g., a positive/negative photoresist) comprising a dye/pigment, a dispersant polymer, a polymerization monomer, and/or other chemicals (e.g., chemicals for the polymerization reaction). In yet further embodiments, the first plurality of light filters 118 are at least partially translucent to light.

In some embodiments, the first light filter grid structure 120 comprises a first dielectric material having a second refractive index that is less than the first refractive index. In further embodiments, the first refractive index squared minus the second refractive index squared is less than about 0.25. In further embodiments, the first light filter grid structure 120 may comprise, for example, an oxide (e.g., silicon dioxide ($SiO_2$)), a nitride (e.g., silicon nitride (SiN)), an oxy-nitride (e.g., silicon oxynitride ($SiO_XN_Y$)), or the like. In further embodiments, the first refractive index squared minus the second refractive index squared is less than about 0.25. In yet further embodiments, the first light filter grid structure 120 is at least partially translucent to light.

Because both the first plurality of light filters 118 and the first light filter grid structure 120 are at least partially translucent, both the first plurality of light filters 118 and the first light filter grid structure 120 may guide light toward the plurality of photodetectors 102. Further, because the first refractive index is greater than the second refractive index, light incident to the first plurality of light filters 128 is confined to the first plurality of light filters 118 (e.g., due total internal reflection), respectively, and is guided onto the plurality of photodetectors 102. In addition, because the second refractive index is less than the first refractive index, most light incident to the first light filter grid structure 130 is guided to the first plurality of light filters 118 and refracted toward the plurality of photodetectors 102, thereby guiding most of the light incident to the first light filter grid structure 130 onto the plurality of photodetectors 102. Thus, the wave guide filter 112 may have a substantially planar upper surface and focus incident radiation onto the plurality of photodetectors 102, thereby decreasing the negative effects caused by diffraction in scaled down microlenses. Accordingly, the wave guide filter 112 may improve the quantum efficiency (QE) of complementary metal-oxide semiconductor image sensors (CISs) having scaled down feature sizes (e.g., less than about 1 micrometer (um)).

In some embodiments, a height H of the first light filter grid structure 120 is greater than about 0.8 um. More specifically, in some embodiments, the height H of the first light filter grid structure 120 is between about 0.8 urn and about 2.0 urn. In further embodiments, if the height H of the first light filter grid structure 120 is greater than about 0.8 urn, the height H of the first light filter grid structure 120 is large enough that the light incident to the first light filter grid structure 130 may be guided to the first plurality of light filters 118, thereby improving an amount of incident radiation that the wave guide filter 112 guides onto the photodetectors 102. In yet further embodiments, if the height H of the first light filter grid structure 120 is less than about 2.0 urn, the height H of the first light filter grid structure 120 is small enough that the light incident to the first light filter grid structure 130 may be guided to the first plurality of light filters 118 with enough energy that the first plurality of light filters 118 may refract the incident light 130 onto the plurality of photodetectors 102, thereby improving an amount of incident radiation that the wave guide filter 112 guides onto the photodetectors 102. Thus, if the height H of the first light filter grid structure 120 is less than about 0.8 urn and/or greater than about 2.0 urn, it will be appreciated that an amount of incident light (e.g., 128/130) that the wave guide filter 112 guides onto the photodetectors 102 may be negatively affected.

In some embodiments, the width W of the first light filter grid structure 120 is between about 1/6 of a width (e.g., a distance between opposite sides of one of the plurality of photodetectors 102) of one of the plurality of photodetectors 102 and about 1/3 of the width of the one of the plurality of photodetectors 102. For example, if the widths of the plurality of photodetectors 102 are about 0.9 urn, respectively, the width W of the first light filter grid structure 120 may be between about 0.15 urn and about 0.3 urn. In further embodiments, if the width W of the first light filter grid structure 120 is greater than about 1/6 of the width of the one of the plurality of photodetectors 102, the width W of the first light filter grid structure 120 is large enough that the light incident to the first light filter grid structure 130 may be guided to the first plurality of light filters 118, thereby improving an amount of incident radiation that the wave guide filter 112 guides onto the photodetectors 102. In yet further embodiments, if the width W of the first light filter grid structure 120 is less than about 1/3 of the width of the one of the plurality of photodetectors 102, the width W of the first light filter grid structure 120 is small enough that the light incident to the first light filter grid structure 130 may be guided to the first plurality of light filters 118 with enough energy that the first plurality of light filters 118 may refract the incident light 130 onto the plurality of photodetectors 102, thereby improving an amount of incident radiation that the wave guide filter 112 guides onto the photodetectors 102. Thus, if the width W of the first light filter grid structure 120 is less than about 1/6 of the width of the one of the plurality of photodetectors 102 and/or greater than about 1/3 of the width of the one of the plurality of photodetectors 102, it will be appreciated that an amount of incident light (e.g., 128/130) that the wave guide filter 112 guides onto the photodetectors 102 may be negatively affected.

Figure 2A:
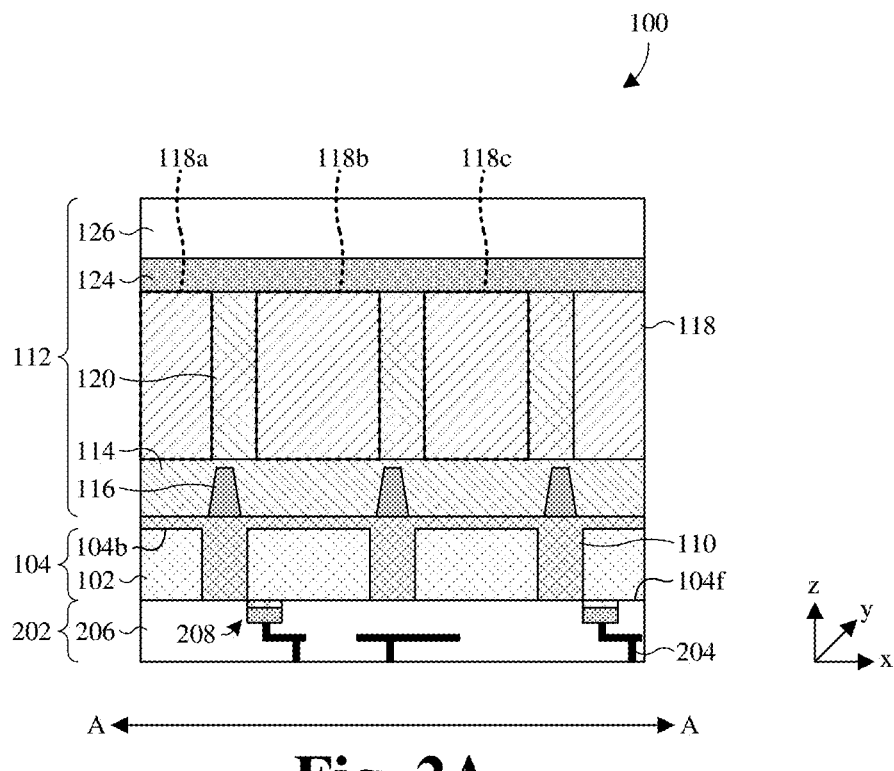
FIGS. 2A-2B illustrate various views of some other embodiments of the image sensor of FIGS. 1A-1B.
Figure 2B:
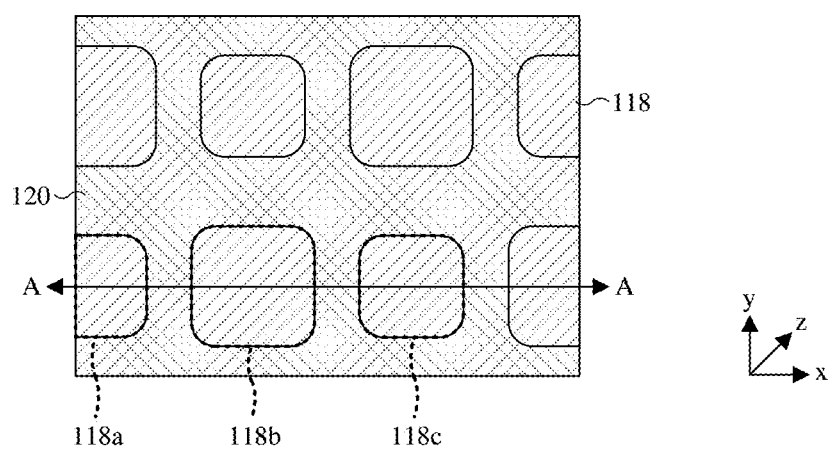

FIGS. 2A-2B illustrate various views of some embodiments of the image sensor of FIGS. 1A-1B. FIG. 2A illustrates a cross-sectional view taken along line A-A of FIG. 2B. FIG. 2B illustrates a view of the image sensor facing a back-side of the semiconductor substrate.

As shown in FIGS. 2A-2B, the first plurality of light filters 118 may have different footprints. For example, the first light filter 118a may have a smaller footprint than the second light filter 118b. In such embodiments, the first light filter 118a may have a substantially similar footprint as the third light filter 118c. In further embodiments, the some of the light filters of the first plurality of light filters 118 that have a larger footprint may each guide light in a same wavelength range. For example, the some of the light filters of the first plurality of light filters 118 that have a larger footprint may be green color filters, while the some other light filters of the first plurality of light filters 118 that have a smaller footprint may be red color filters and/or blue color filters. Because the first plurality of light filters 118 may have different footprints, an overall spectrum of light that the wave guide filter 112 guides may be selectively tuned. For example, the wave guide filter may be selectively tuned, such that the quantum efficiency (QE) of green light is greater than the QE of red and/or blue light.

In some embodiments, the first light filter grid structure 120 may not be vertically aligned with the metal grid 116. For example, in some embodiments, portions of the first light filter grid structure 120 may be shifted laterally (e.g., along an x-axis and/or a y-axis) in relation to portions of the metal grid 116, respectively. For example, a first portion of the first light filter grid structure 120 is disposed between the second light filter 118b and the third light filter 118c. In some embodiments, the first portion of the first light filter grid structure 120 may be shifted in a first lateral direction (e.g., along the x-axis in a first direction) in relation to a portion of the metal grid 116 disposed directly beneath the first portion of the first light filter grid structure 120. In further embodiments, a second portion of the first light filter grid structure 120 is disposed on a side of the third light filter 118c opposite the first portion of the first light filter grid structure 120. In yet further embodiments, the second portion of the first light filter grid structure 120 may be shifted in a second lateral direction opposite the first lateral direction (e.g., along the x-axis in a second direction opposite the first direction) in relation to a portion of the metal grid 116 disposed directly beneath the second portion of the first light filter grid structure 120.

In some embodiments, a metallization structure 202 is disposed on a front-side 104*f* of the semiconductor substrate 104. The metallization structure 202 comprises an interconnect structure 204 (e.g., a copper interconnect) disposed in an interlayer dielectric (ILD) layer 206. The interconnect structure 204 comprises a plurality of conductive features (e.g., metal lines, metal vias, metal contacts, etc.) that electrically couple a plurality of semiconductor devices 208 (e.g., a transfer transistor(s), reset transistor(s), etc.) together.

Figure 3:
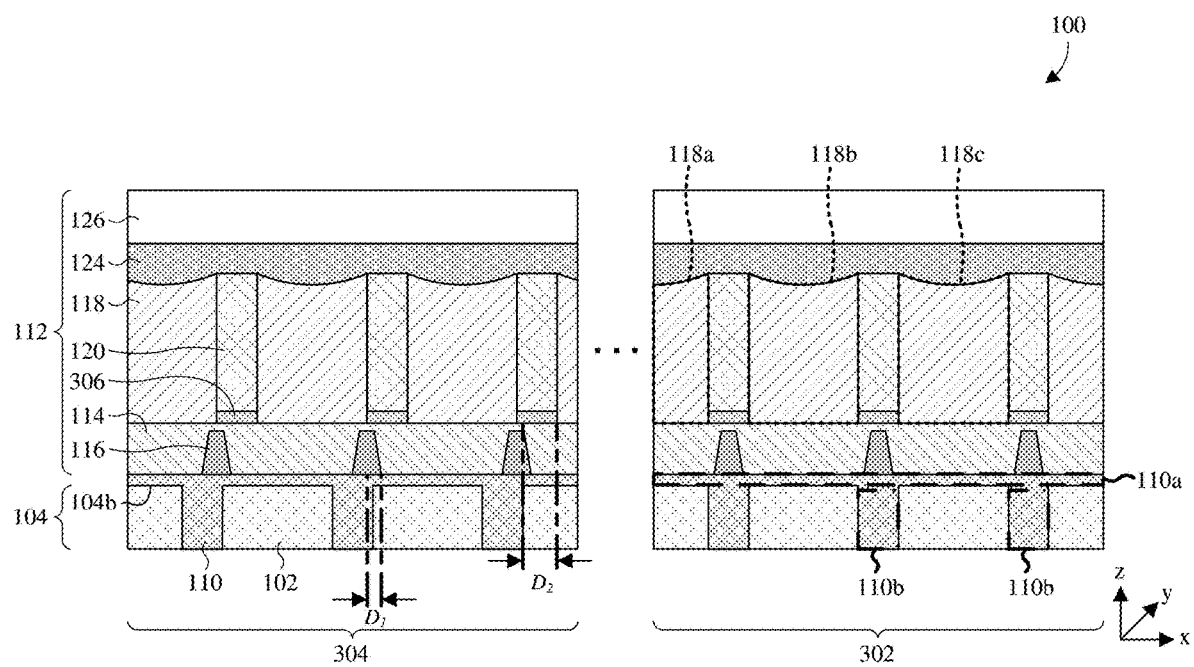
FIG. 3 illustrates a cross-sectional view of some more detailed embodiments of the image sensor of FIGS. 1A-1B.

FIG. 3 illustrates a cross-sectional view of some more detailed embodiments of the image sensor of FIGS. 1A-1B.

As shown in FIG. 3, the image sensor 100 comprise a central region 302 and a peripheral region 304. The peripheral region 304 is disposed between an edge of the semiconductor substrate 104 and the central region 302. It will be appreciated that a plurality of peripheral regions may be disposed on opposite sides of the central region 302, such that the peripheral regions are disposed between opposite edges of the semiconductor substrate 104 and the central region 302.

In some embodiments, the isolation structure 110 comprises an upper isolation structure region 110*a* that is disposed over the semiconductor substrate 104 and extends along the back-side 104*b* of the semiconductor substrate 104. In further embodiments, the isolation structure 110 comprises a plurality of deep trench isolation (DTI) structures 110*b* that extend from the upper isolation structure region 110*a* into the semiconductor substrate 104. In further embodiments, the DTI structures 110*b* extend vertically into the semiconductor substrate 104 between the plurality of photodetectors 102. In further embodiments, the isolation structure 110 may comprise, for example, an oxide (e.g., $SiO_2$), a nitride (e.g., SiN), an oxy-nitride (e.g., $SiO_XN_Y$), or the like. In yet further embodiments, the DTI structures 110*b* may be back-side DTI structures.

In some embodiments, the dielectric layer 114 may comprise, for example, an oxide (e.g., $SiO_2$), a nitride (e.g., (SiN), an oxy-nitride (e.g., $SiO_XN_Y$), or the like. In further embodiments, the dielectric layer 114 and the isolation structure 110 may be a same material. In other embodiments, the dielectric layer 114 may comprise a different material than the isolation structure 110.

In the central region 302, in some embodiments, a layout of the metal grid 116 may be about vertically aligned with a layout of the DTI structures 110*b*. For example, in the central region 302, the layout of the metal grid 116 may directly overlie the layout of the DTI structures 110*b*. In the peripheral region 304, in some embodiments, the layout of the metal grid 116 may be shifted toward the central region 302 in relation to the layout of the DTI structures 110*b*. For example, in the peripheral region 304, the layout of the metal grid 116 may be shifted (e.g., along the x-axis and/or y-axis) in relation to the layout of the DTI structures 110*b*. In further embodiments, the layout of the metal grid 116 in the peripheral region 304 is shifted toward the central region 302 by a first distance $D_1$. In further embodiments, the first distance $D_1$ is less than or equal to about half of the width of the one of the plurality of photodetectors 102. In yet further embodiments, the width of the one of the plurality of photodetectors 102 may be less than or equal to about 1 um.

In some embodiments, a patterned etch stop layer 306 is disposed between the first light filter grid structure 120 and the dielectric layer 114. In further embodiments, the patterned etch stop layer 306 may comprise, for example, an oxide (e.g., $SiO_2$), a nitride (e.g., SiN), an oxy-nitride (e.g., $SiO_XN_Y$), or the like. In yet further embodiments, the patterned etch stop layer 306 comprises a different material than the first light filter grid structure 120.

In the central region 302, in some embodiments, the layout of the first light filter grid structure 120 may be about vertically aligned with the layout of the metal grid 116. For example, in the central region 302, the layout of the first light filter grid structure 120 may directly overlie the layout of the metal grid 116. In the peripheral region 304, in some embodiments, the layout of the first light filter grid structure 120 may be shifted (e.g., along the x-axis and/or y-axis) toward the central region 302 in relation to the layout of the metal grid 116. In further embodiments, the layout of the first light filter grid structure 120 in the peripheral region 304 may be shifted toward the central region 302 by a second distance $D_2$. In further embodiments, the second distance $D_2$ is less than or equal to about half of the width of the one of the plurality of photodetectors 102. In yet further embodiments, the second distance $D_2$ is greater than the first distance $D_1$.

In some embodiments, heights of the first light filter grid structure 120 and heights of the first plurality of light filters 118 may differ, such that upper surfaces of the first light filter grid structure 120 and upper surfaces of the first plurality of light filters 118 are not co-planar. In further embodiments, the upper surfaces of the first plurality of light filters 118 may be non-planar. For example, an upper surface of one of the first plurality of light filters 118 may be concave.

In some embodiments, the first interface layer 124 is configured to provide a substantially planar surface in which a layer(s) may be subsequently formed on, such that the subsequent layer(s) may be formed with a substantially planar upper surface. For example, the first interface layer 124 may have a substantially planar upper surface while being disposed on a non-planar surface comprising the upper surfaces of the first light filter grid structure 120 and the upper surfaces of the first plurality of light filters 118, thereby providing a substantially planar surface on which the ARC 126 may be formed. In further embodiments, the first interface layer 124 may have self-leveling properties, such that the first interface layer 124 fills in differences in heights between the first plurality of light filters 118 and the first light filter grid structure 120. In yet further embodiments, the first interface layer 124 may comprise, for example, a spin-on dielectric (e.g., $SiO_2$), a photoresist (e.g., a positive/negative photoresist), a resin (e.g., a phenol formaldehyde resin, epoxy-resin, etc.), a polymer, or the like.

In some embodiments, the ARC 126 is disposed on the substantially planar upper surface of the first interface layer 124. In further embodiments, the upper surface of the ARC 126 is substantially planar due to, at least in part, the substantially planar upper surface of the first interface layer 124. In further embodiments, the ARC 126 comprises, for example, an oxide (e.g., $SiO_2$), a nitride (e.g., SiN), or the like.

Figure 4:
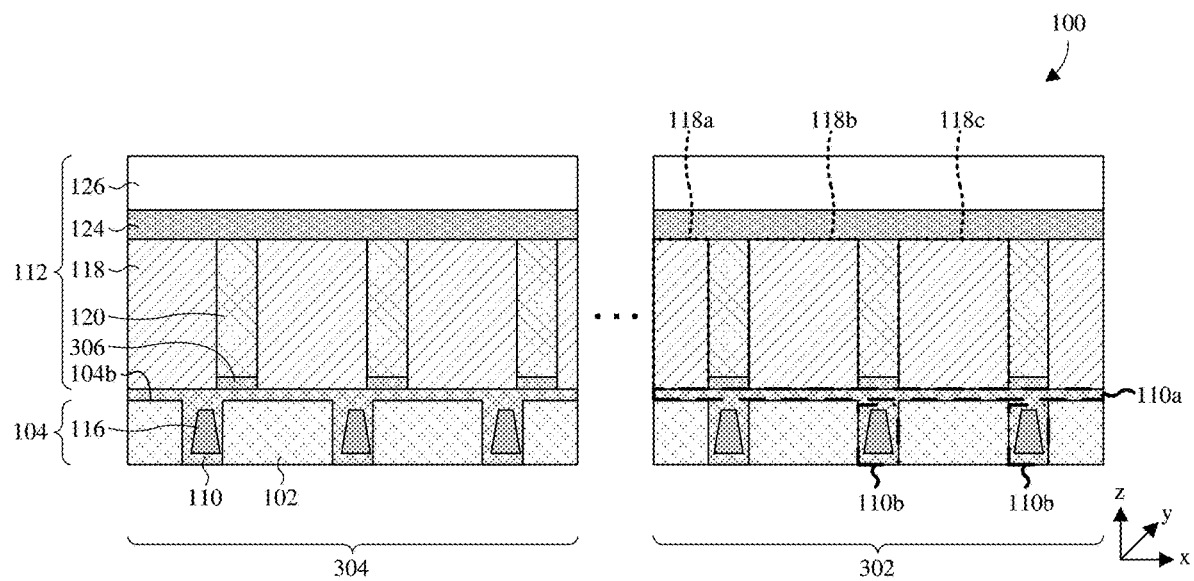
FIG. 4 illustrates a cross-sectional view of some other embodiments of the image sensor of FIG. 3.

FIG. 4 illustrates a cross-sectional view of some other embodiments of the image sensor of FIG. 3.

As shown in FIG. 4, the metal grid 116 is disposed within the isolation structure 110. In some embodiments, the metal grid 116 is disposed within the DTI structures 110*b*. In further embodiments, upper surfaces of the metal grid 116 are disposed beneath the back-side 104*b* of the semiconductor substrate 104. In the central region 302, in some embodiments, the metal grid 116 may be disposed in the DTI structures 110b, such that a portion of the metal grid 116 disposed in a corresponding DTI structure is spaced about evenly from opposite sides of the corresponding DTI structure. In the peripheral region 304, in some embodiments, the metal grid 116 may be disposed in the DTI structures 110b and shifted toward the central region 302, such that a portion of the metal grid 116 disposed in a corresponding DTI structure is disposed closer to one side of the corresponding DTI structure than an opposite side of the corresponding DTI structure. In yet further embodiments, the first plurality of light filters 118 and the patterned etch stop layer 306 may be disposed on the upper isolation structure region 110a.

Figure 5:
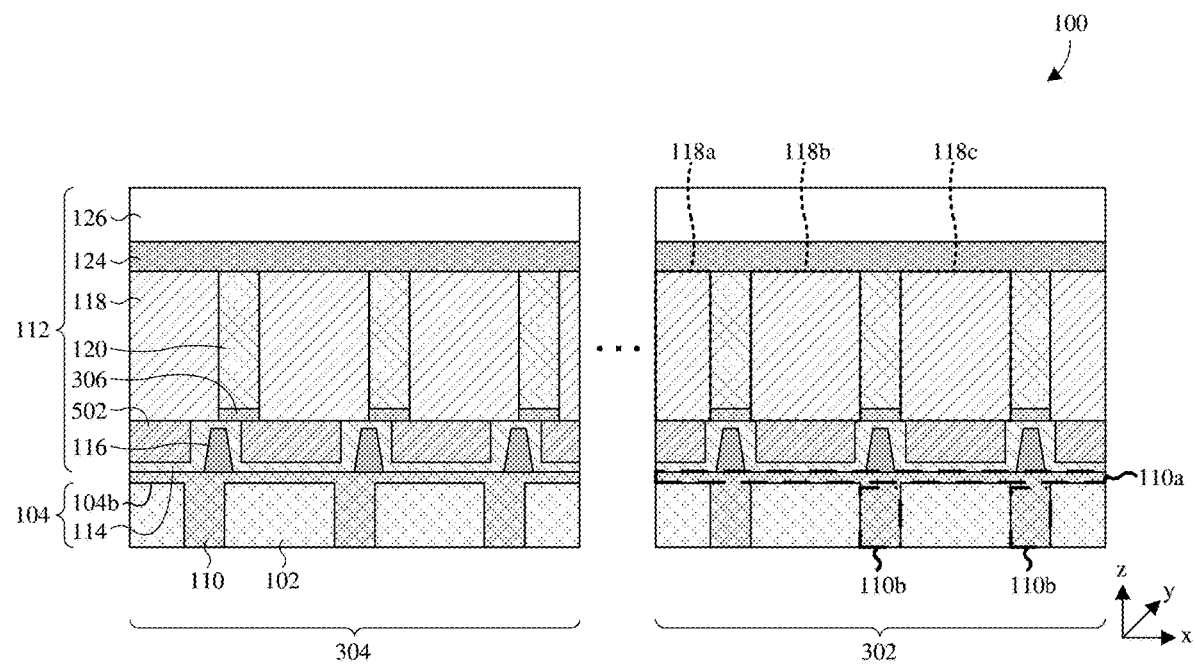
FIG. 5 illustrates a cross-sectional view of some other embodiments of the image sensor of FIG. 3.

FIG. 5 illustrates a cross-sectional view of some other embodiments of the image sensor of FIG. 3.

As shown in FIG. 5, a plurality of noise reducing structures 502 are disposed in the dielectric layer 114. The plurality of noise reducing structures 502 are configured to reduce noise (e.g. crosstalk) that may negatively affect performance of the image sensor 100. In some embodiments, each of the plurality of noise reducing structures 502 is disposed between neighboring portions of the metal grid 116. In further embodiments, the noise reducing structures 502 have a higher refractive index than the dielectric layer 114. In yet further embodiments, the noise reducing structures 502 may comprise, for example, a nitride (e.g., SiN), an oxy-nitride (e.g., $SiO_XN_Y$), or the like.

In some embodiments, each of the plurality of noise reducing structures 502 may be about evenly spaced from the neighboring portions of the metal grid 116 in which they are disposed between. In further embodiments, upper surfaces of the plurality of noise reducing structures 502 are co-planar with an upper surface of the dielectric layer 114. In yet further embodiments, the first plurality of light filters 118, the patterned etch stop layer 306, and/or the first light filter grid structure 120 may be disposed on the noise reducing structures 502.

Figure 6:
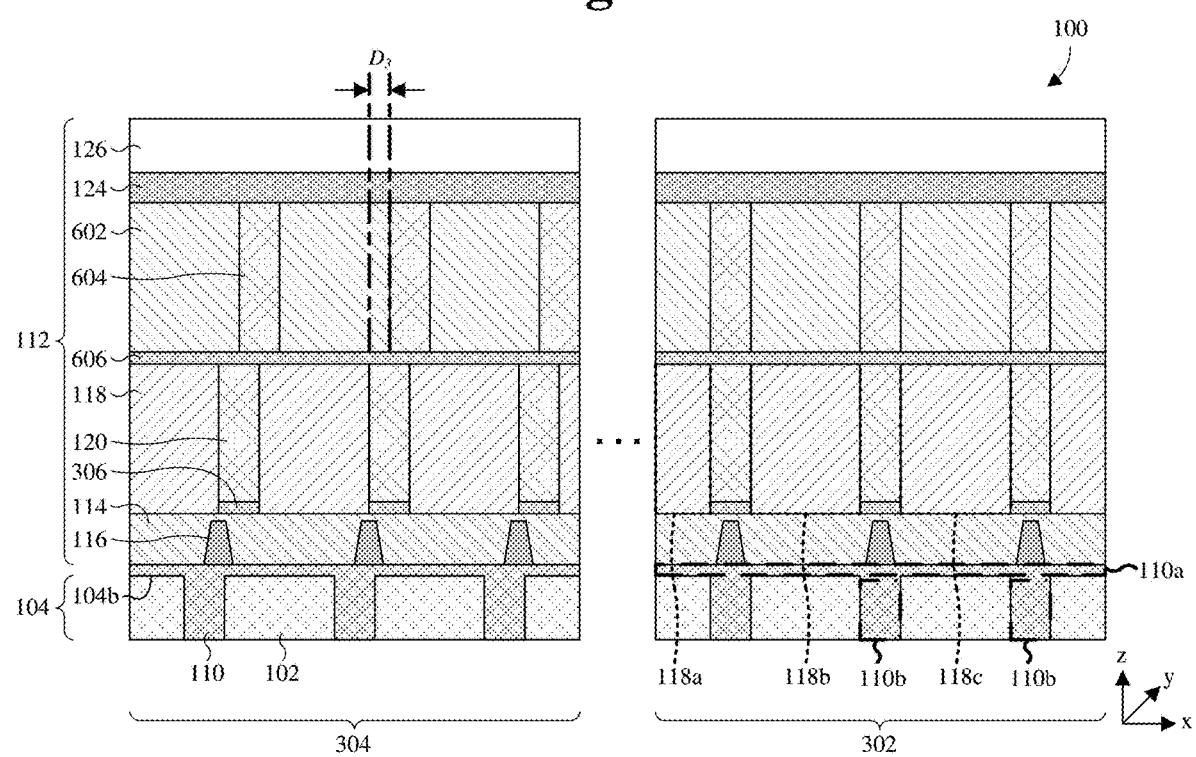
FIG. 6 illustrates a cross-sectional view of some other embodiments of the image sensor of FIG. 3.

FIG. 6 illustrates a cross-sectional view of some other embodiments of the image sensor of FIG. 3.

As shown in FIG. 6, a second plurality of light filters 602 are disposed in a second light filter grid structure 604. In some embodiments, the second plurality of light filters 602 comprise a second light filtering material having a third refractive index. The second light filtering material may comprise, for example, a photoresist (e.g., a positive/negative photoresist) comprising a dye/pigment, a dispersant, a polymer, a polymerization monomer, and/or other chemicals (e.g., chemicals for the polymerization reaction). In further embodiments, the second light filtering material and the first light filtering material may be a same material. In other embodiments, the second light filtering material and the first light filtering material may be different materials. In yet further embodiments, a combined height of the second light filter gird structure 604 and the first light filter grid structure 120 is greater than about 0.8 um. More specifically, in some embodiments, the combined height of the second light filter grid structure 604 and the first light filter grid structure 120 is between about 0.8 um and about 2.0 um.

In some embodiments, the third refractive index may be between about 1.4 and about 4. In further embodiments, the third refractive index may be about the same as the first refractive index. In other embodiments, the third refractive index may be different than the first refractive index. In yet further embodiments, the second plurality of light filters 602 are at least partially translucent to light.

In some embodiments, the second light filter grid structure 604 comprises a second dielectric material having a fourth refractive index that is less than the third refractive index. In further embodiments, the second light filter grid structure 604 may comprise, for example, an oxide (e.g., $SiO_2$), a nitride (e.g., SiN), an oxy-nitride (e.g., $SiO_XN_Y$), or the like. In yet further embodiment, the second dielectric material and the first dielectric material may be a same material. In other embodiments, the second dielectric material and the first dielectric material may be different materials.

In some embodiments, the third refractive index squared minus the fourth refractive index squared is less than about 0.25. In further embodiments, the fourth refractive index may be about the same as the second refractive index. In other embodiments, the fourth refractive index may be different than the second refractive index. In further embodiments, the second light filter grid structure 604 is at least partially translucent to light.

In some embodiments, the first, second, third, and/or fourth refractive indexes may be selectively tuned. In further embodiments, the first refractive index may be selectively tuned by, for example, selectively choosing a specific material for the first light filtering material (e.g., choosing an oxide or a nitride), selectively choosing a specific composition of the first light filtering material (e.g., choosing a specific amount of dye/pigment in the first light filtering material), or the like. In further embodiments, the third refractive index may be selectively tuned in a substantially similar way as the first refractive index. In further embodiments, the second refractive index may be selectively tuned by, for example, selectively choosing a specific material for the second light filtering material (e.g., choosing an oxide or a nitride); selectively choosing a specific composition of the second light filtering material (e.g., choosing a specific porosity of the second light filtering material); forming the first light filter grid structure 120 with a plurality of layers having different refractive indexes (e.g., having a first layer covered by a second layer), such that the refractive index of the plurality of layers is a specific second refractive index; or the like. In yet further embodiments, the fourth refractive index may be selectively tuned in a substantially similar way as the second refractive index.

In some embodiments, the first interface layer 124 is disposed over both the second plurality of light filters 602 and the second light filter grid structure 604. In such embodiments, the first interface layer 124 may fill in differences in heights between the second plurality of light filters 602 and the second light filter grid structure 604.

In some embodiments, a second interface layer 606 separates the first plurality of light filters 118 and the first light filter grid structure 120 from the second plurality of light filters 602 and the second light filter grid structure 604. In further embodiments, the second interface layer 606 has a substantially planar upper surface. In further embodiments, the second interface layer 606 is configured to provide a substantially planar upper surface in which a layer(s) may be subsequently formed on, such that the subsequent layer(s) may be formed with a substantially planar upper surface. For example, the second interface layer 606 may have a substantially planar upper surface while being disposed on a non-planar surface comprising the upper surfaces of the first light filter grid structure 120 and the upper surfaces of the first plurality of light filters 118. In yet further embodiments, the second interface layer 606 may have self-leveling properties, such that the second interface layer 606 fills in differences in heights between the first plurality of light filters 118 and the first light filter grid structure 120.

In some embodiments, the second interface layer 606 may comprise, for example, a spin-on dielectric (e.g., $SiO_2$), a photoresist (e.g., a positive/negative photoresist), a resin (e.g., a phenol formaldehyde resin, epoxy-resin, etc.), a polymer, or the like. In further embodiments, the second interface layer 606 and the first interface layer 124 may be a same material. In other embodiments, the second interface layer 606 and the first interface layer 124 may be different materials.

In some embodiments, the second plurality of light filters 602 and the second light filter grid structure 604 may be disposed on the second interface layer 606. In further embodiments, the second plurality of light filters 602 may be color filters. In further embodiments, the second plurality of light filters 602 may be IR filters configured to filter incident radiation having an IR wavelength. In further embodiments, the second plurality of light filters 602 may comprise a combination of color filters and IR filters.

In the central region 302, in some embodiments, a layout of the second light filter grid structure 604 may be about vertically aligned with the layout of the first light filter grid structure 120. In the peripheral region 304, in some embodiments, a layout of the second light filter grid structure 604 may be shifted toward the central region 302 by a third distance $D_3$. In further embodiments, the third distance $D_3$ is less than or equal to about half of the width of the one of the plurality of photodetectors 102. In yet further embodiments, the third distance $D_3$ and the second distance $D_2$ may be about the same. In other embodiments, the third distance $D_3$ and the second distance $D_2$ may be different.

In some embodiments, when the wave guide filter 112 comprises the second light filter grid structure 604 and the first light filter grid structure 120, the wave guide filter 112 may further improve edge performance of the image sensor by, for example, having the layout of the second light filter grid structure 604 in the peripheral region 304 shifted in relation to the layout of the first light filter grid structure 120 in the peripheral region 304 (e.g., shifted toward the central region 302 or away from the central region 302). In addition, when the wave guide filter 112 comprises both the second plurality of light filters 602 and the first plurality of light filters 118, the wave guide filter 112 may be utilized in additional image sensor applications due to the wave guide filter 112 filtering a range of wavelengths of incident radiation that a wave guide filter 112 comprising only one of the second plurality of light filters 602 or the first plurality of light filters 118 may filter.

Figure 7A:
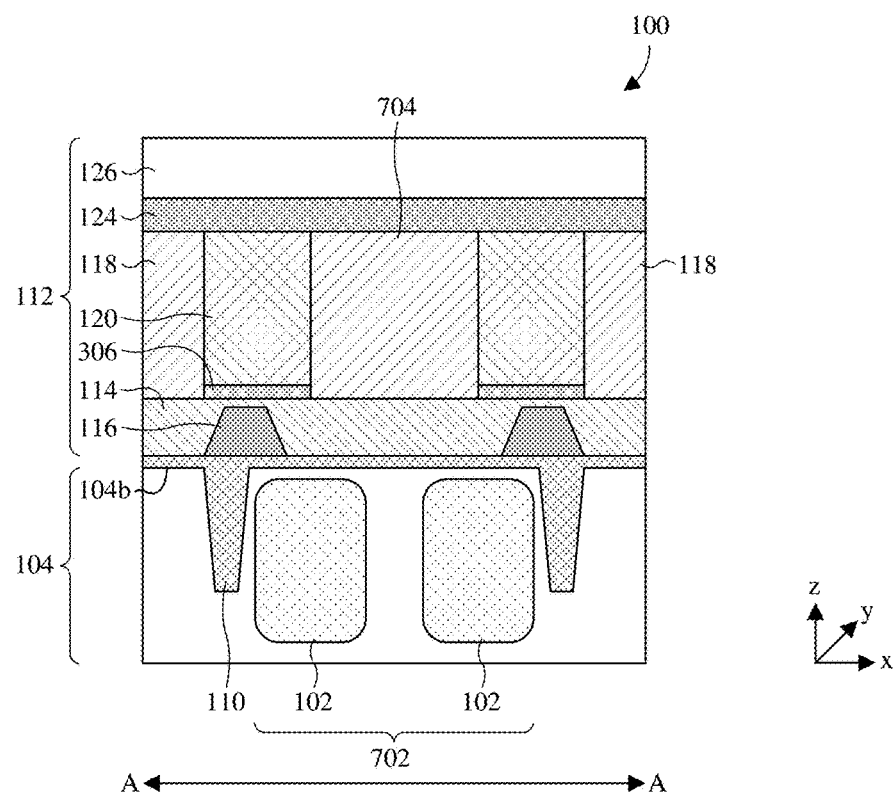
FIGS. 7A-7B illustrate various views of some other embodiments of the image sensor of FIGS. 1A-1B.
Figure 7B:
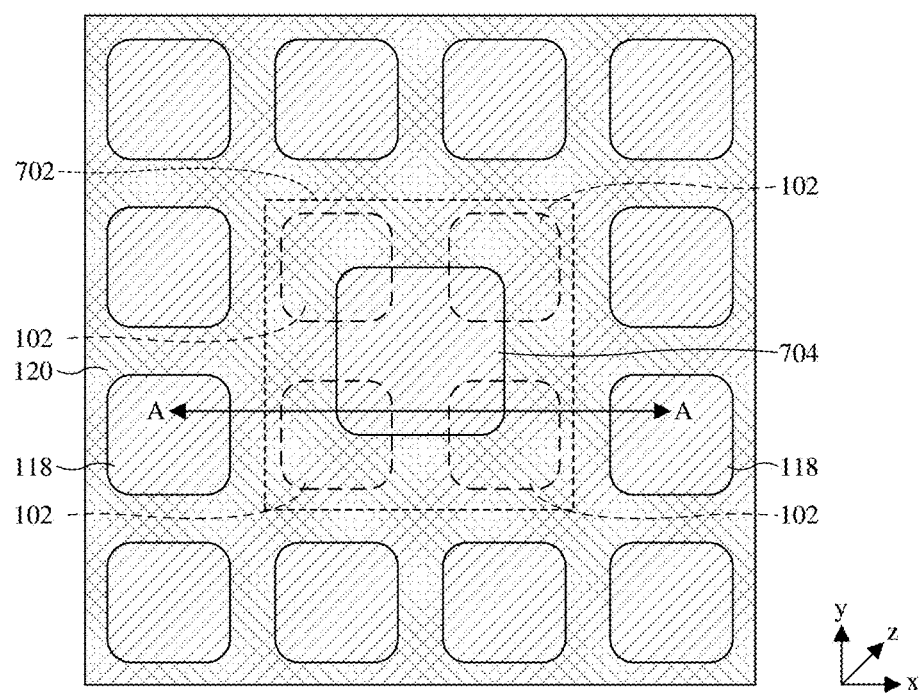

FIGS. 7A-7B illustrate various views of some other embodiments of the image sensor of FIGS. 1A-1B. FIG. 7A illustrates a cross-sectional view taken along line A-A of FIG. 7B. FIG. 7B illustrates a view of the image sensor facing a back-side of the semiconductor substrate.

As shown in FIGS. 7A-7B, a group of photodetectors 702 is disposed in the semiconductor substrate 104. In some embodiments, the plurality of photodetectors 102 of the group of photodetectors 702 are arranged in a photodetector array comprising one or more rows and one or more columns. For example, the photodetector array may comprise two columns and two rows (e.g., a 2×2 structure). It will be appreciated that the photodetector array may comprise other combinations of rows and columns, for example, one row and two columns (e.g., a 2×1 structure).

In some embodiments, a common light filter 704 is disposed over the group of photodetectors 702. In further embodiments, the common light filter 704 at least partially covers the group of photodetectors 702. Because the common light filter 704 at least partially covers the group of photodetectors 702, the image sensor 100 may be able to detect differences in where incident radiation focuses onto the plurality of photodetectors 102 of the group of photodetectors 702. Accordingly, the image sensor 100 may have autofocus capabilities (e.g., phase detection auto focus).

In some embodiments, the common light filter 704 may cover a portion of each of the plurality of photodetectors 102 of the group of photodetectors 702. In further embodiments, the common light filter 704 may be centrally disposed over the group of the photodetectors 702, such that the common light filter 704 covers a substantially similar sized portion of each of the plurality of photodetectors 102 of the group of photodetectors 702. In further embodiments, the first plurality of light filters 118 may be disposed around sides of the common light filter 704. In such embodiments, light filters of the first plurality of light filters 118 disposed on opposite sides of the common light filter 704 may be spaced about a same distance from the common light filter 704.

Figure 8A:
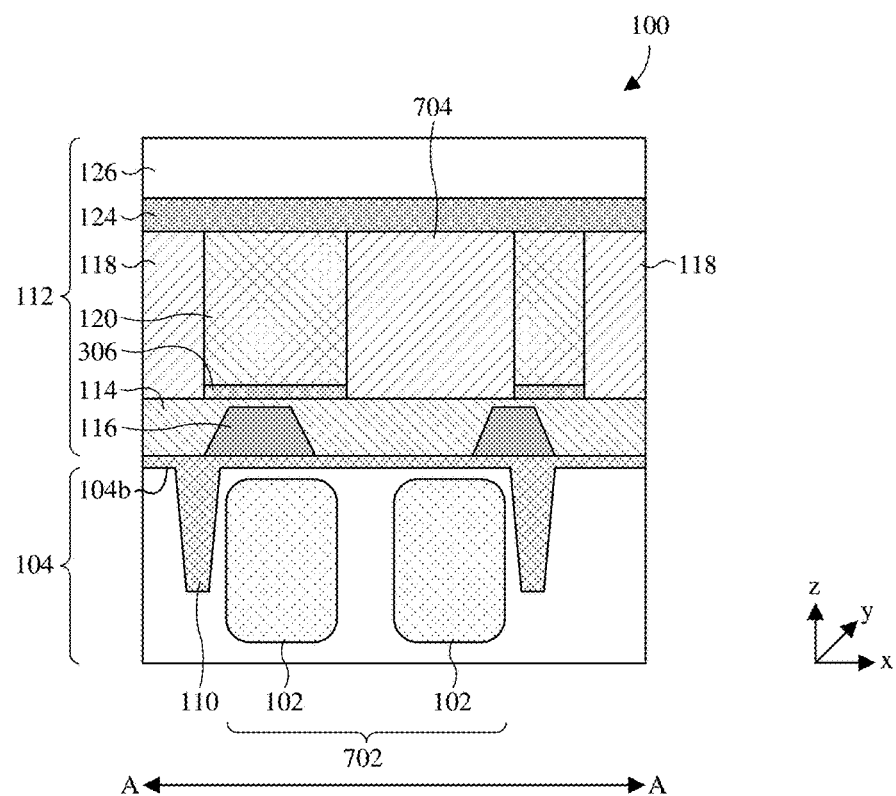
FIGS. 8A-8B illustrate various views of some other embodiments of the image sensor of FIGS. 7A-7B.
Figure 8B:
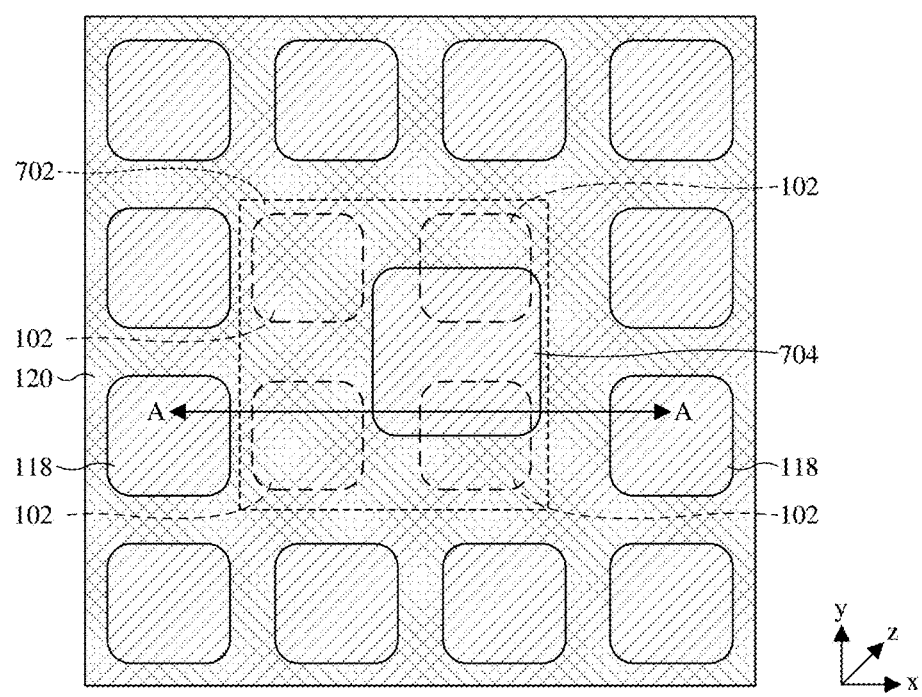

FIGS. 8A-8B illustrate various views of some embodiments of the image sensor of FIGS. 7A-7B. FIG. 8A illustrates a cross-sectional view taken along line A-A of FIG. 8B. FIG. 8B illustrates a view of the image sensor facing a back-side of the semiconductor substrate.

As shown in FIGS. 8A-8B, the common light filter 704 is shifted in a lateral direction (e.g., along the x-axis). In some embodiments, the first plurality of light filters 118 disposed around the sides of the common light filter 704 may be shifted in the lateral direction. In further embodiments, the common light filter 704 may be shifted a greater distance in the lateral direction than the first plurality of light filters 118. In yet further embodiments, the common light filter 704 may cover portions of some of the plurality of photodetectors 102 of the group of photodetectors 702, and not cover portions of some other of the plurality of photodetectors 102 of the group of photodetectors 702.

In some embodiments, portions of the first light filter grid structure 120 may have different widths. For example, in some embodiments, a first portion of the first light filter grid structure 120 is disposed on a first side of the common light filter 704, and second portion of the first light filter grid structure 120 is disposed on a second side of the common light filter 704 opposite the first side. In such embodiments, the first portion of the first light filter grid structure 120 may have a greater width than the second portion of the first light filter grid structure 120.

In further embodiments, portions of the metal grid 116 may have different widths. For example, in some embodiments, a first portion of the metal grid 116 is disposed on the first side of the common light filter 704, and a second portion of the metal grid 116 is disposed on the second side of the common light filter 704. In such embodiments, the first portion of metal grid 116 may have a greater width than the second portion of the metal grid 116.

FIGS. 9-19 illustrate a series of cross-sectional views of some embodiments of a method for forming the image sensor of FIG. 6.

Figure 9:
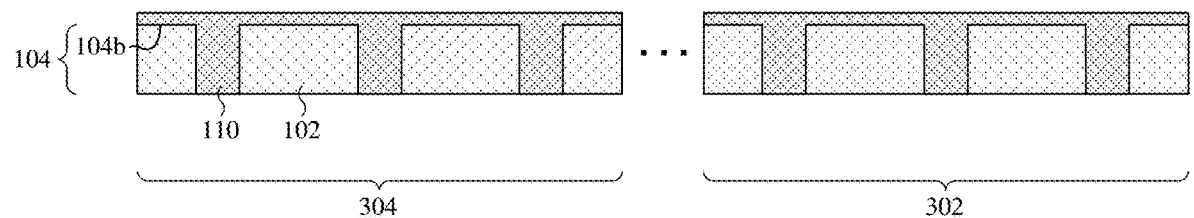
FIGS. 9-19 illustrate a series of cross-sectional views of some embodiments of a method for forming the image sensor of FIG. 6.

As shown in FIG. 9, an isolation structure 110 is formed over/in the semiconductor substrate 104. In some embodiments, the isolation structure 110 is formed on a back-side 104b of the semiconductor substrate 104. In further embodiments, a process for forming the isolation structure 110 comprises selectively etching the semiconductor substrate 104 to form trenches in the semiconductor substrate 104 that extend into the semiconductor substrate 104 from a back-side 104b of the semiconductor substrate 104. In some embodiments, the semiconductor substrate 104 is selectively etched by forming a masking layer (not shown) on the back-side 104b of the semiconductor substrate 104, and subsequently exposing the semiconductor substrate 104 to an etchant configured to remove unmasked portions of the semiconductor substrate 104. Thereafter, in some embodiments, the masking layer is stripped away.

Subsequently, a dielectric layer is deposited or grown on the back-side 104b of the semiconductor substrate 104 and in the trenches, thereby forming the isolation structure 110. In some embodiments, the dielectric layer may be deposited or grown by, for example, chemical vapor deposition (CVD), physical vapor deposition (PVD), atomic layer deposition (ALD), thermal oxidation, sputtering, some other deposition or growth process, or a combination of the foregoing. In further embodiments, the dielectric material may comprise, for example, an oxide (e.g., $SiO_2$), a nitride (e.g., SiN), an oxy-nitride (e.g., $SiO_XN_Y$), or the like. In yet further embodiments, a planarization process (e.g., chemical-mechanical planarization (CMP)) may be performed on the isolation structure 110 to form a substantially planar upper surface.

Figure 10:
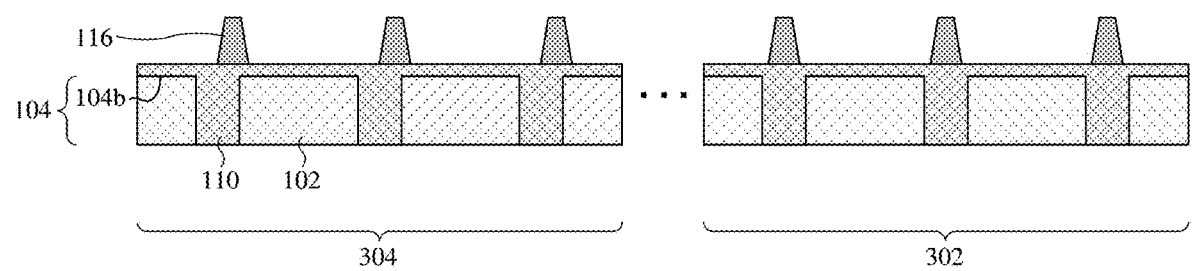

As shown in FIG. 10, a metal grid 116 is formed over the isolation structure 110. In some embodiments, a process for forming the metal grid 116 comprises depositing a conductive layer (not shown) on the isolation structure 110. In further embodiments, the conductive layer may be deposited on the isolation structure 110 by, for example, CVD, PVD, ALD, sputtering, electrochemical plating, electroless plating, some other deposition process, or a combination of the foregoing. In further embodiments, the conductive layer may comprise, for example, tungsten, copper, aluminum, or the like. Thereafter, the conductive layer is selectively etched by forming a masking layer (not shown) on the conductive layer, and subsequently exposing the conductive layer to an etchant configured to remove unmasked portions of the conductive layer, thereby forming the metal grid 116. In some embodiments, the masking layer is subsequently stripped away.

Figure 11:
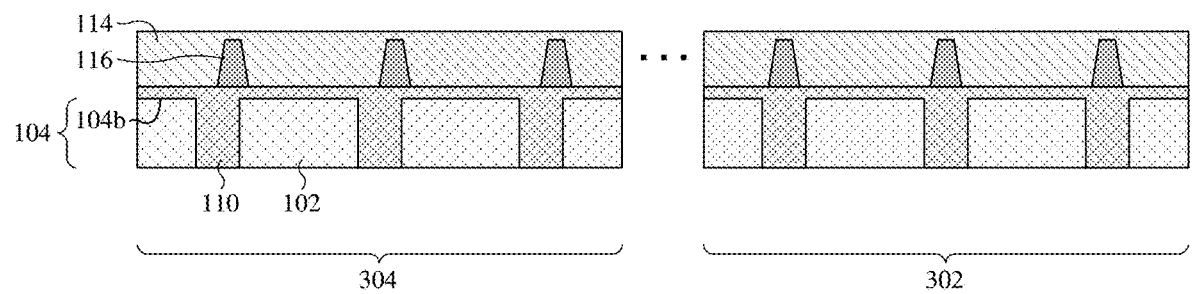

As shown in FIG. 11, a dielectric layer 114 is formed over the metal grid 116 and the isolation structure 110. In some embodiments, a process for forming the dielectric layer 114 comprises depositing the dielectric layer 114 on the metal grid 116 and the isolation structure 110. In further embodiments, the dielectric layer 114 may be deposited by, for example, CVD, PVD, ALD, sputtering, some other deposition process, or a combination of the foregoing. In yet further embodiments, a planarization process (e.g., CMP) may be performed on the dielectric layer 114 to form a substantially planar upper surface.

Figure 12:
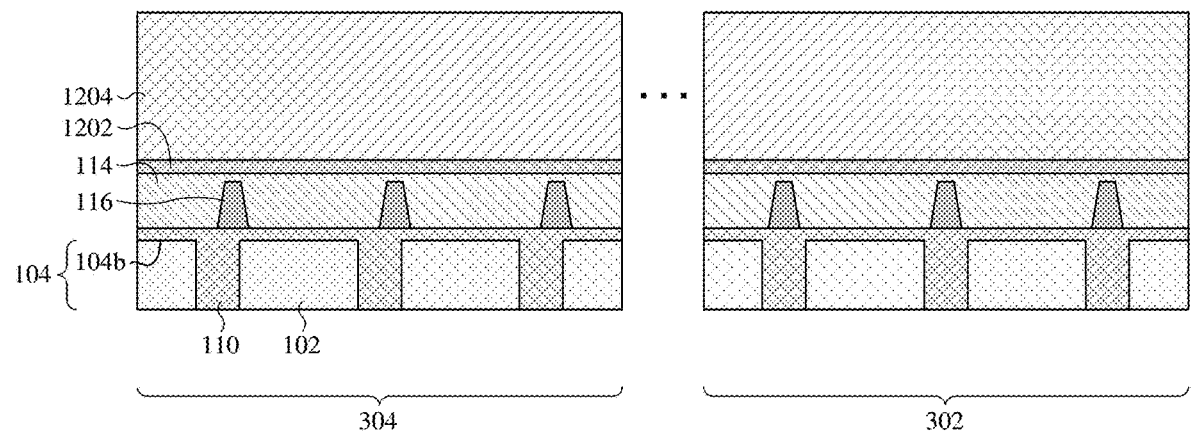

As shown in FIG. 12, an etch stop layer 1202 is formed over the dielectric layer 114. In some embodiments, a process for forming the etch stop layer 1202 comprises depositing the etch stop layer 1202 on the dielectric layer 114. In further embodiments, the etch stop layer 1202 may be deposited by, for example, CVD, PVD, ALD, sputtering, some other deposition process, or a combination of the foregoing. In yet further embodiments, the etch stop layer 1202 may comprise, for example, an oxide (e.g., $SiO_2$), a nitride (e.g., SiN), an oxy-nitride (e.g., $SiO_XN_Y$), or the like.

Also shown in FIG. 12, a first light filter grid layer 1204 is formed over the etch stop layer 1202. In some embodiments, a process for forming the first light filter grid layer 1204 comprises depositing the first light filter grid layer 1204 onto the etch stop layer 1202. In some embodiments, the first light filter grid layer 1204 may be deposited on the etch stop layer 1202 by, for example, CVD, PVD, ALD, sputtering, some other deposition process, or a combination of the foregoing. In some embodiments, the first light filter grid layer 1204 may comprise, for example, an oxide (e.g., $SiO_2$), a nitride (e.g., SiN), an oxy-nitride (e.g., $SiO_XN_Y$), or the like. In yet further embodiments, the first light filter grid layer 1204 is at least partially translucent to light.

Figure 13:
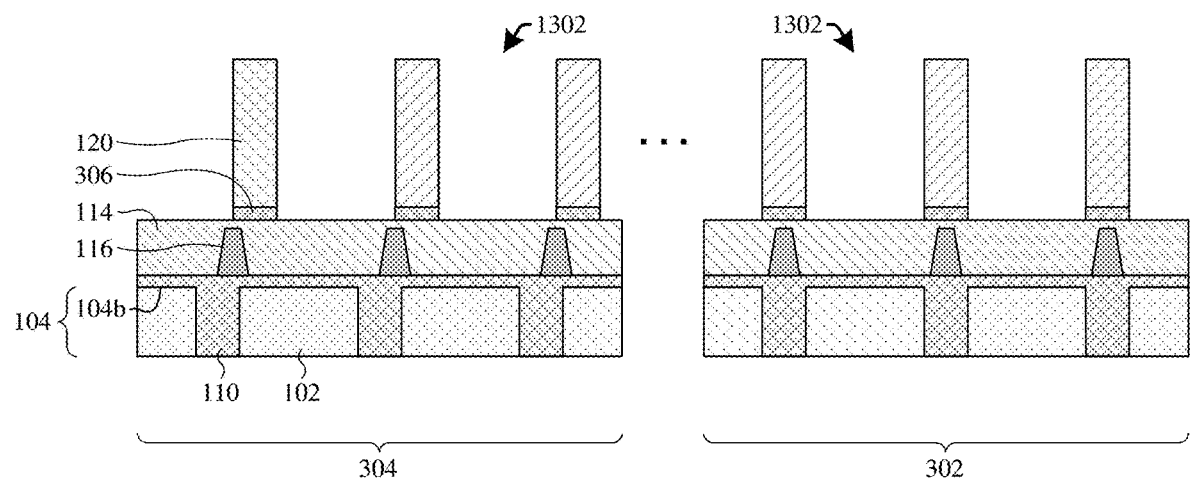

As shown in FIG. 13, a first light filter grid structure 120 and a patterned etch stop layer 306 are formed over the dielectric layer 114. Further, in forming the first light filter grid structure 120 and the patterned etch stop layer 306, a plurality of first light filter trenches 1302 are formed over the dielectric layer 114. In some embodiments, each of the plurality of first light filter trenches 1302 are defined by an upper surface of the dielectric layer 114, sidewalls of the first light filter grid structure 120, and sidewalls of the patterned etch stop layer 306.

In some embodiments, a process for forming the first light filter grid structure 120 and the patterned etch stop layer 306 comprises selectively etching the first light filter grid layer 1204 (see, e.g., FIG. 12) and the etch stop layer 1202 (see, e.g., FIG. 12). In further embodiments, the first light filter grid layer 1204 and the etch stop layer 1202 may be selectively etched by forming a masking layer (not shown) on the first light filter grid layer 1204, and subsequently exposing the first light filter grid layer 1204 to an etchant configured to remove unmasked portions of the first light filter grid layer 1204 and unmasked portions of the etch stop layer 1202, thereby forming the first light filter grid structure 120 and the patterned etch stop layer 306. In some embodiments, the masking layer is subsequently stripped away. It will be appreciated that, in some embodiments, multiple etching processes may be performed to form the first light filter grid structure 120 and the patterned etch stop layer 306.

Figure 14:
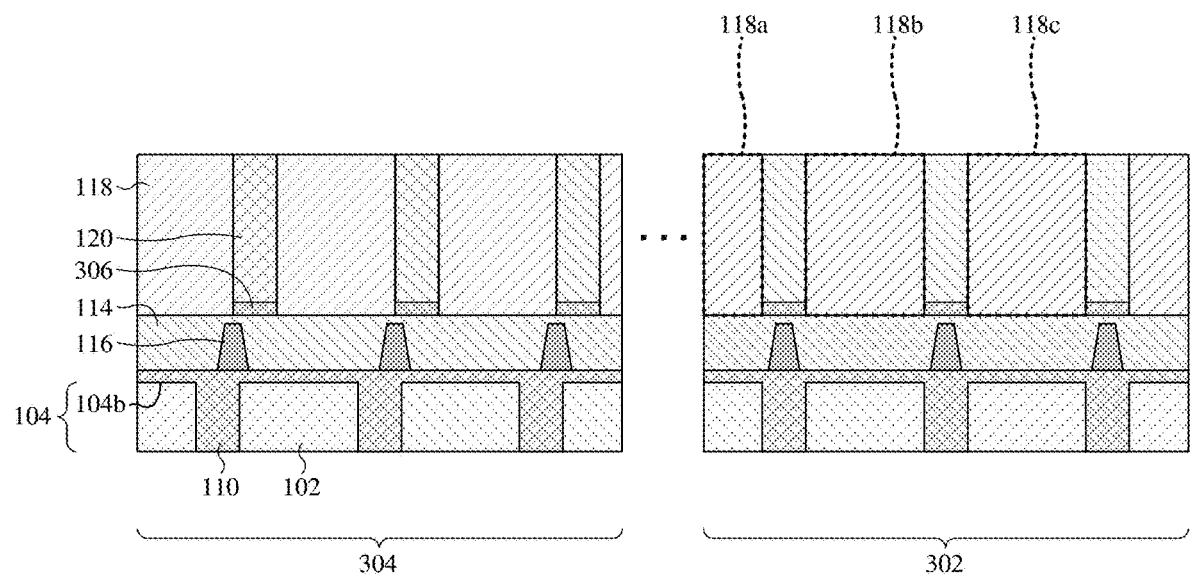

As shown in FIG. 14, a first plurality of light filters 118 are formed over the dielectric layer 114 and in the first light filter grid structure 120. In some embodiments, a process for forming the first plurality of light filters 118 comprises depositing a first light filtering material in the plurality of first light filter trenches 1302 (see, e.g., FIG. 13) and on the dielectric layer 114. In some embodiments, the first light filtering material may be deposited by, for example, a spin-on process, CVD, some other deposition process, or a combination of the foregoing. In further embodiments, depositing the first light filtering material in the plurality of first light filter trenches 1302 may cause upper surfaces of the first plurality of light filters 118 to be non-planar with upper surfaces of the first light filter grid structure 120 (e.g., due to the first light filtering material being deposited by a spin-on process).

In some embodiments, the first plurality of light filters 118 (and thus the first light filtering material) may be formed with a first refractive index. In further embodiments, the first refractive index may be between about 1.4 and about 4. In further embodiments, the first light filter grid structure 120 (and thus the first light filter grid layer 1204) may be formed with a second refractive index that is less than the first refractive index. In further embodiments, the first refractive index squared minus the second refractive index squared is less than about 0.25.

Figure 15:
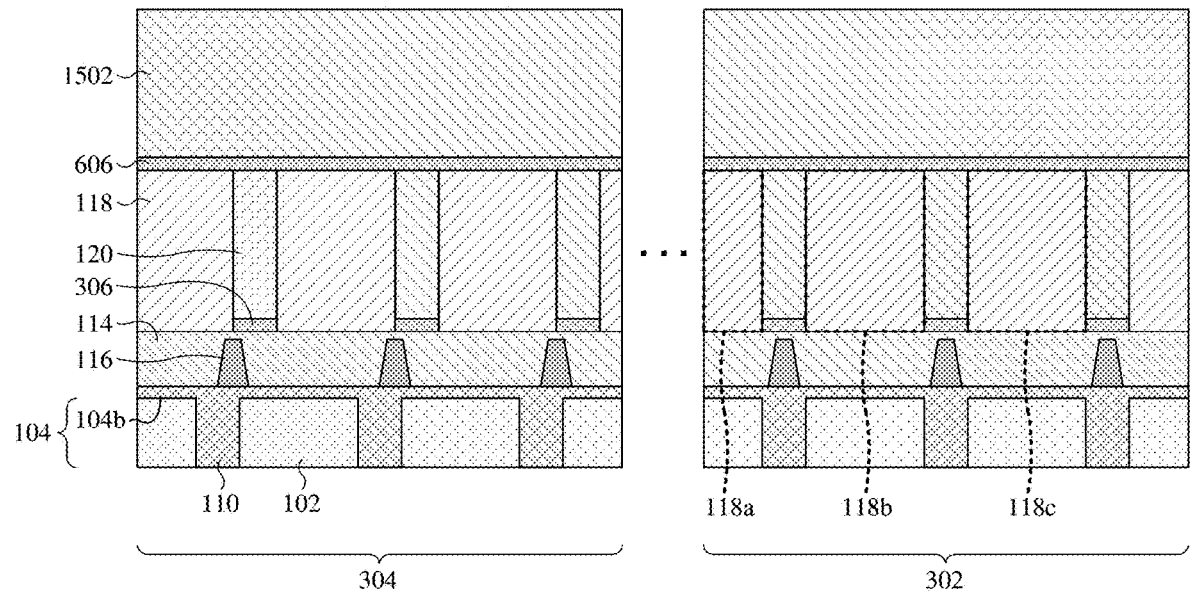

As shown in FIG. 15, a second interface layer 606 is formed over the first plurality of light filters 118 and the first light filter grid structure 120. In some embodiments, a process for forming the second interface layer 606 comprises depositing the second interface layer 606 on the first plurality of light filters 118 and the first light filter grid structure 120. In further embodiments, the second interface layer 606 may be deposited by, for example, a spin-on process, CVD, or some other deposition process. In further embodiments, the second interface layer 606 may be formed with a substantially planar upper surface. In further embodiments, the second interface layer 606 may be formed on a non-planar surface comprising upper surfaces of the first plurality of light filters 118 and upper surfaces of the first light filter grid structure 120.

Also shown in FIG. 15, a second light filter grid layer 1502 is formed over the second interface layer 606. In some embodiments, a process for forming the second light filter grid layer 1502 comprises depositing the second light filter grid layer 1502 on the second interface layer 606. In some embodiments, the second light filter grid layer 1502 may be deposited on the second interface layer 606 by, for example, CVD, PVD, ALD, sputtering, some other deposition process, or a combination of the foregoing. In some embodiments, the second light filter grid layer 1502 may comprise, for example, an oxide (e.g., $SiO_2$), a nitride (e.g., SiN), an oxy-nitride (e.g., $SiO_xN_y$), or the like. In yet further embodiments, the second light filter grid layer 1502 is at least partially translucent to light.

Figure 16:
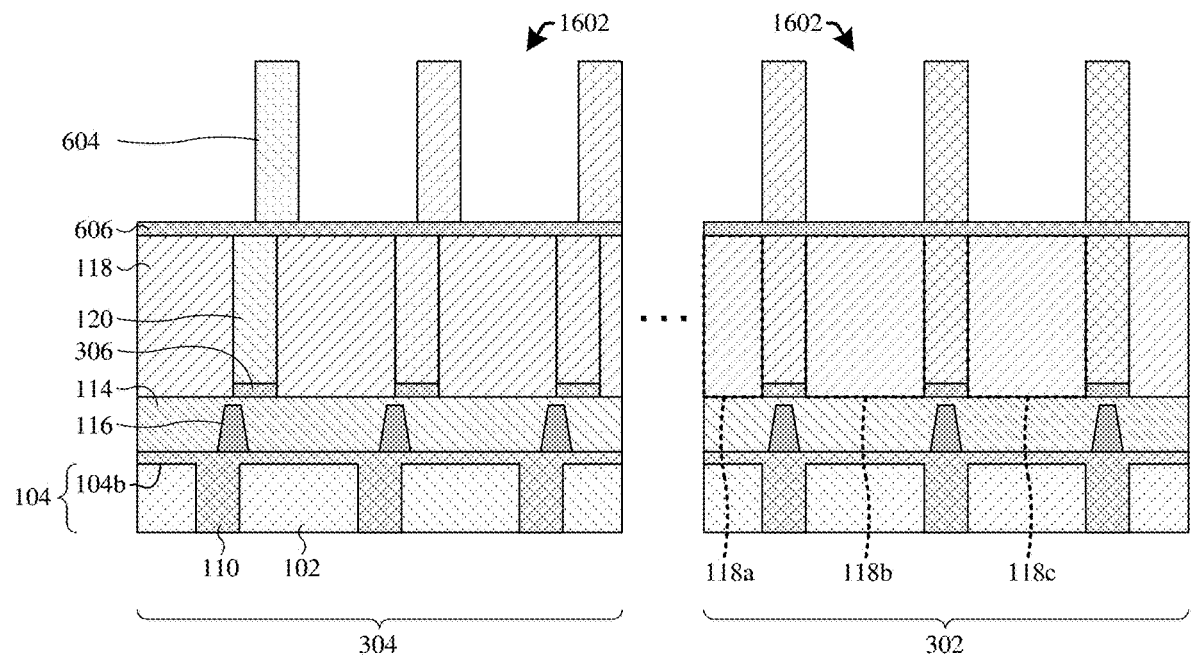

As shown in FIG. 16, a second light filter grid structure 604 is formed over the second interface layer 606. Further, in forming the second light filter grid structure 604, a plurality of second light filter trenches 1602 are formed over the second interface layer 606. In some embodiments, each of the plurality of second light filter trenches 1602 are defined by an upper surface of the second interface layer 606 and sidewalls of the second light filter grid structure 604.

In some embodiments, a process for forming the second light filter grid structure 604 comprises selectively etching the second light filter grid layer 1502 (see, e.g., FIG. 15). In further embodiments, the second light filter grid layer 1502 may be selectively etched by forming a masking layer (not shown) on the second light filter grid layer 1502, and subsequently exposing the second light filter grid layer 1502 to an etchant configured to remove unmasked portions of the second light filter grid layer 1502, thereby forming the second light filter grid structure 604. In some embodiments, the masking layer is subsequently stripped away.

Figure 17:
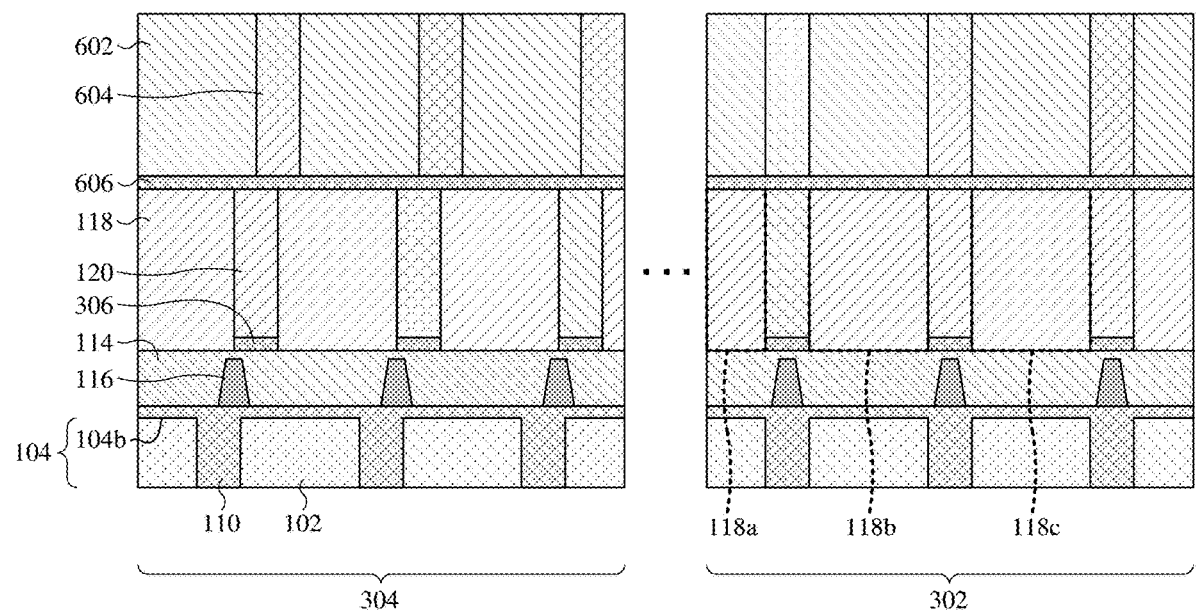

As shown in FIG. 17, a second plurality of light filters 602 are formed over the second interface layer 606 and in the second light filter grid structure 604. In some embodiments, a process for forming the second plurality of light filters 602 comprises depositing a second light filtering material in the plurality of second light filter trenches 1602 (see, e.g., FIG. 15) and on the second interface layer 606. In some embodiments, the second light filtering material may be deposited by, for example, a spin-on process, CVD, some other deposition process, or a combination of the foregoing. In further embodiments, depositing the second light filtering material in the second light filter trenches 1602 may cause upper surfaces of the second plurality of light filters 602 to be non-planar with upper surfaces of the second light filter grid structure 604 (e.g., due to the second light filtering material being deposited by a spin-on process).

In some embodiments, the second plurality of light filters 602 (and thus the second light filtering material) may be formed with a third refractive index. In further embodiments, the third refractive index may be between about 1.4 and about 4. In further embodiments, the second light filter grid structure 604 (and thus the second light filter grid layer 1502) may be formed with a fourth refractive index that is less than the third refractive index. In yet further embodiments, the third refractive index squared minus the fourth refractive index squared is less than about 0.25.

Figure 18:
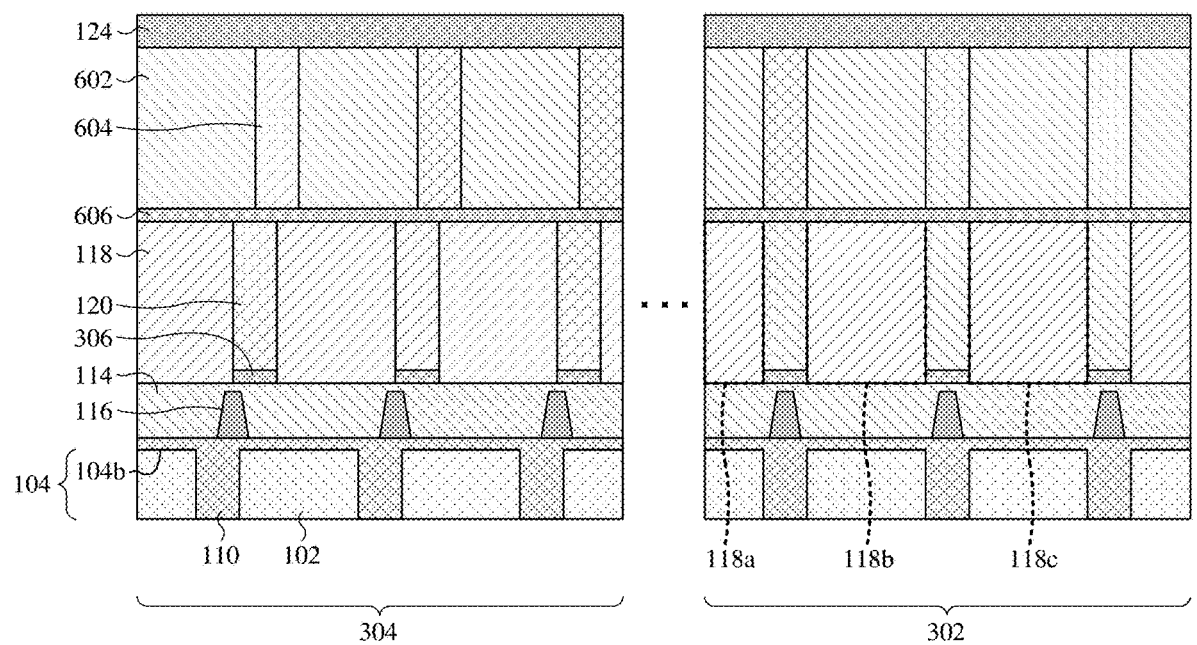

As shown in FIG. 18, a first interface layer 124 is formed over the second plurality of light filters 602 and the second light filter grid structure 604. In some embodiments, a process for forming the first interface layer 124 comprises depositing the first interface layer 124 on the second plurality of light filters 602 and the second light filter grid structure 604. In further embodiments, the first interface layer 124 may be deposited by, for example, a spin-on process, CVD, or some other deposition process. In further embodiments, the first interface layer 124 may be formed with a substantially planar upper surface. In further embodiments, the first interface layer 124 may be formed on a non-planar surface comprising upper surfaces of the second plurality of light filters 602 and upper surfaces of the second light filter grid structure 604.

Figure 19:
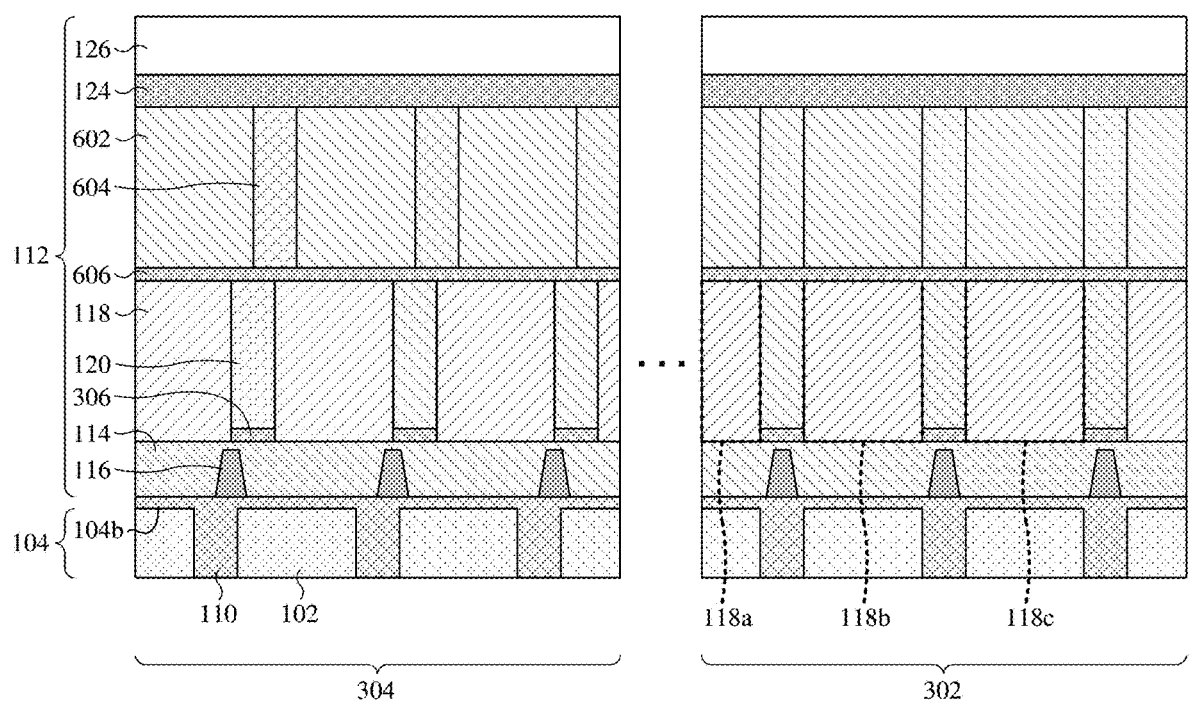

As shown in FIG. 19, an anti-reflective coating (ARC) 126 is formed on the first interface layer 124. In some embodiments, a process for forming the ARC 126 comprises depositing the ARC 126 on the first interface layer 124. In further embodiments, the ARC 126 may be deposited on the first interface layer 124 by, for example, CVD, PVD, ALD, sputtering, some other deposition process, or a combination of the foregoing. In further embodiments, the ARC 126 is formed with a substantially planar upper surface. In further embodiments, the ARC 126 may be formed with a substantially planar upper surface due to, at least in part, the substantially planar upper surface of the first interface layer 124. In yet further embodiments, after the ARC 126 is formed, formation of the wave guide filter 112 is complete.

Figure 20:
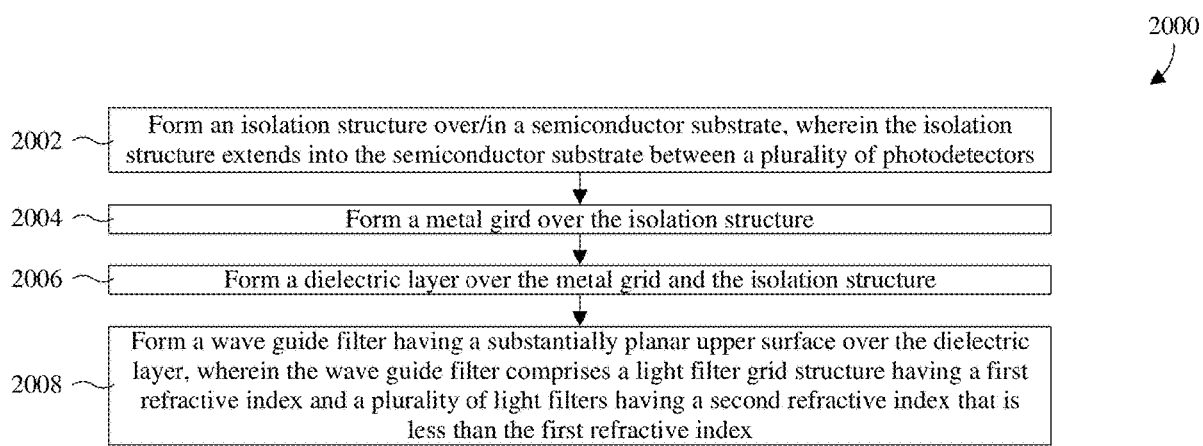
FIG. 20 illustrates a flowchart of some embodiments of a method for forming an image sensor comprising a wave guide filter having a substantially planar upper surface.

As illustrated in FIG. 20, a flowchart 2000 of some embodiments of a method for forming an image sensor comprising a wave guide filter having a substantially planar upper surface is provided. While the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 2002, an isolation structure is formed over/in a semiconductor substrate, wherein the isolation structure extends into the semiconductor substrate between a plurality of photodetectors. FIG. 9 illustrates a cross-sectional view of some embodiments corresponding to act 2002.

At 2004, a metal grid is formed over the isolation structure. FIG. 10 illustrates a cross-sectional view of some embodiments corresponding to act 2004.

At 2006, a dielectric layer is formed over the metal grid and the isolation structure. FIG. 11 illustrates a cross-sectional view of some embodiments corresponding to act 2006.

At 2008, a wave guide filter having a substantially planar upper surface is formed over the dielectric layer. The wave guide filter comprises a light filter grid structure having a first refractive index and a plurality of light filters having a second refractive index that is less than the first refractive index. FIGS. 12-19 illustrate a series of cross-sectional views of some embodiments corresponding to act 2008.

Because the first refractive index is greater than the second refractive index, light incident to the plurality of light filters is confined to the plurality of light filters (e.g., due total internal reflection), respectively, and is guided onto the plurality of photodetectors. In addition, because the second refractive index is less than the first refractive index, light incident to the light filter grid structure is guided to the plurality of light filters and refracted toward the plurality of photodetectors, thereby guiding the light incident to the first light filter grid structure onto the plurality of photodetectors.

Thus, the wave guide filter may have a substantially planar upper surface and focus incident radiation onto the plurality of photodetectors, thereby decreasing the negative diffraction effects caused by scaled down microlenses. Accordingly, the wave guide filter may improve the quantum efficiency (QE) of complementary metal-oxide semiconductor image sensors (CISs) having scaled down feature sizes (e.g., less than about 1 micrometer (um)).

In some embodiments, the present application provides an image sensor. The image sensor comprises a photodetector disposed in a semiconductor substrate. A wave guide filter having a substantially planar upper surface is disposed over the photodetector. The wave guide filter comprises a light filter disposed in a light filter grid structure. The light filter comprises a first material that is translucent and has a first refractive index. The light filter grid structure comprises a second material that is translucent and has a second refractive index less than the first refractive index.

In other embodiments, the present application provides an image sensor. The image sensor comprises a photodetector disposed in a semiconductor substrate. A first light filter grid structure is disposed over a back-side of the semiconductor substrate. The back-side of the semiconductor substrate is opposite a front-side of the semiconductor substrate. A metallization structure is disposed on the front-side of the semiconductor substrate. A first light filter is disposed in the first light filter grid structure. A dielectric layer is disposed over the back-side of the semiconductor substrate and disposed between the photodetector and the first light filter. A metal grid is disposed in the dielectric layer, wherein the metal grid comprises a first portion disposed on a first side of the photodetector and a second portion disposed on a second side of the photodetector opposite the first side of the photodetector.

In yet other embodiments, the present application provides a method for forming an image sensor. The method comprises forming an isolation structure on a semiconductor substrate. A metal grid is formed on the isolation structure. A dielectric layer is formed on the isolation structure and covering the metal grid. A first light filter grid structure is formed over the dielectric layer. A first light filter is formed in the first light filter grid structure. A first interface layer is formed over both the first light filter grid structure and the first light filter. A second light filter grid structure is formed over the first interface layer. A second light filter is formed in the second light filter grid structure. A second interface layer is formed over both the second light filter grid structure and the second light filter. An anti-reflective coating (ARC) is formed over the second interface layer, wherein the ARC is formed with a substantially planar upper surface.

An anti-reflective coating (ARC) is formed on the substantially planar upper surface of the interface layer, wherein the ARC is formed with a substantially planar upper surface. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a photodetector disposed in a semiconductor substrate;
a light filter grid structure disposed over a back-side of the semiconductor substrate, the back-side of the semiconductor substrate opposite a front-side of the semiconductor substrate, wherein a metallization structure is disposed on the front-side of the semiconductor substrate;
a light filter disposed in the light filter grid structure;
a dielectric layer disposed over the back-side of the semiconductor substrate and between the photodetector and the light filter;
a metal grid disposed in the dielectric layer, wherein the metal grid comprises a first portion disposed on a first side of the photodetector and a second portion disposed on a second side of the photodetector opposite the first side of the photodetector; and
a noise reducing structure disposed vertically between the light filter and the back-side of the semiconductor substrate, wherein the noise reducing structure is disposed laterally between the first portion of the metal grid and the second portion of the metal grid;
wherein the dielectric layer has a base portion extending laterally over an upper surface of the photodetector and between a lower portion of the first portion of the metal grid and a lower portion of the second portion of the metal grid, and wherein the dielectric layer has an upper portion extending upwardly along sidewalls of the first portion and second portion of the metal grid.

2. The image sensor of claim 1, wherein the noise reducing structure at least partially covers the photodetector.

3. The image sensor of claim 2, wherein:
the dielectric layer is a first material; and
the noise reducing structure is a second material different than the first material.

4. An image sensor, comprising:
a photodetector disposed in a semiconductor substrate;
a light filter grid structure disposed over a first side of the semiconductor substrate;
a light filter disposed in the light filter grid structure;
a dielectric layer disposed over the first side of the semiconductor substrate and between the photodetector and the light filter;
a metal grid disposed in the dielectric layer, wherein the metal grid comprises a first portion disposed on a first side of the photodetector and a second portion disposed on a second side of the photodetector opposite the first side of the photodetector; and
a noise reducing structure disposed vertically between the light filter and the first side of the semiconductor substrate and laterally between the first portion of the metal grid and the second portion of the metal grid, wherein the noise reducing structure has a first refractive index that is higher than a second refractive index of the dielectric layer, and wherein the light filter grid structure has a third refractive index that is less than a fourth refractive index of the light filter, wherein the fourth refractive index squared minus the third refractive index squared is less than about 0.25.

5. The image sensor of claim 4, wherein a chemical composition of the noise reducing structure is different than a chemical composition of the dielectric layer.

6. The image sensor of claim 4, wherein the noise reducing structure is at least partially disposed in the dielectric layer.

7. The image sensor of claim 4, wherein an upper surface of the noise reducing structure is substantially co-planar with an upper surface of the dielectric layer.

8. The image sensor of claim 4, wherein an uppermost surface of the metal grid is disposed vertically between the semiconductor substrate and an uppermost surface of the noise reducing structure.

9. The image sensor of claim 4, wherein the first side of the semiconductor substrate is opposite a second side of the semiconductor substrate, and wherein a metallization structure is disposed on the second side of the semiconductor substrate.

10. The image sensor of claim 4, wherein the noise reducing structure overlies the photodetector.

11. The image sensor of claim 4, wherein the first portion of the metal grid and the second portion of the metal grid are spaced laterally about a same distance from the noise reducing structure.

12. An image sensor, comprising:
a plurality of photodetectors disposed in a semiconductor substrate;
a light filter grid structure disposed over a back-side of the semiconductor substrate;
a light filter disposed in the light filter grid structure;
a dielectric layer disposed over the back-side of the semiconductor substrate and vertically between the plurality of photodetectors and the light filter; and
a plurality of noise reducing structures disposed vertically between the light filter and the back-side of the semiconductor substrate, wherein the plurality of noise reducing structures overlie the plurality of photodetectors, respectively, and wherein the plurality of noise reducing structures have a higher refractive index than the dielectric layer,
wherein
a first group of photodetectors of the plurality of photodetectors are disposed in a central region of the image sensor and a second group of photodetectors of the plurality of photodetectors are disposed in a peripheral region of the image sensor;
a first group of noise reducing structures of the plurality of noise reducing structures are disposed in the central region of the image sensor and a second group of noise reducing structures of the plurality of noise reducing structures are disposed in the peripheral region of the image sensor; and
the second group of noise reducing structures are shifted toward the central region of the image sensor in relation to the second group of photodetectors.

13. The image sensor of claim 12, further comprising:
a metal grid disposed vertically between the light filter and the back-side of the semiconductor substrate, wherein a portion of the metal grid is disposed laterally between two neighboring noise reducing structures of the plurality of noise reducing structures.

14. The image sensor of claim 13, wherein the metal grid is disposed at least partially in the dielectric layer.

15. The image sensor of claim 12, wherein the light filter grid structure overlies at least some of the plurality of noise reducing structures.

16. The image sensor of claim 12, wherein a layout of the light filter grid structure in the peripheral region of the image sensor is shifted toward the central region of the image sensor in relation to a layout of the second group of photodetectors.

17. The image sensor of claim 16, wherein the layout of the light filter grid structure in the peripheral region of the image sensor partially overlies a layout of the second group of noise reducing structures.

18. The image sensor of claim 1, wherein a chemical composition of the noise reducing structure is different than a chemical composition of the dielectric layer.

19. The image sensor of claim 1, wherein an upper surface of the noise reducing structure is substantially co-planar with an upper surface of the dielectric layer.

20. The image sensor of claim 1, wherein
a first group of photodetectors are disposed in a central region of the image sensor and a second group of photodetectors are disposed in a peripheral region of the image sensor;
a first group of noise reducing structures are disposed in the central region of the image sensor and a second group of noise reducing structures are disposed in the peripheral region of the image sensor; and
the second group of noise reducing structures are shifted toward the central region of the image sensor in relation to the second group of photodetectors.

* * * * *